US011605485B2

(12) United States Patent
Asai et al.

(10) Patent No.: US 11,605,485 B2
(45) Date of Patent: Mar. 14, 2023

(54) COMMON MODE FILTER (71) Applicant: TDK Corporation, Tokyo (JP)

(72) Inventors: Yugo Asai, Tokyo (JP); Tsutomu Kobayashi, Tokyo (JP); Daisuke Urabe, Tokyo (JP); Hiroshi Suzuki, Tokyo (JP); Emi Ito, Yamagata (JP); Toshio Tomonari, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1110 days.

(21) Appl. No.: 16/236,534

(22) Filed: Dec. 30, 2018

(65) Prior Publication Data
US 2019/0228895 A1 Jul. 25, 2019

(30) Foreign Application Priority Data

Jan. 5, 2018 (JP) .............................. JP2018-000750

(51) Int. Cl.
*H01F 17/04* (2006.01)
*H01F 27/28* (2006.01)
*H01F 27/29* (2006.01)
*H03H 1/00* (2006.01)
*H01F 17/00* (2006.01)
*H01F 27/00* (2006.01)

(52) U.S. Cl.
CPC ........... *H01F 17/04* (2013.01); *H01F 17/045* (2013.01); *H01F 27/006* (2013.01); *H01F 27/2823* (2013.01); *H01F 27/292* (2013.01); *H03H 1/00* (2013.01); *H01F 2017/0093* (2013.01); *H03H 2001/0035* (2013.01); *H03H 2001/0092* (2013.01)

(58) Field of Classification Search
CPC .... H01F 17/04; H01F 17/045; H01F 27/2823; H01F 27/292; H01F 2017/0093; H03H 1/00; H03H 2001/0035; H03H 2001/0092
See application file for complete search history.

(56) References Cited

U.S. PATENT DOCUMENTS

2014/0097928 A1* 4/2014 Tomonari ................ H01F 1/047
336/207
2014/0167903 A1* 6/2014 Tomonari ............ H01F 27/2823
336/220

(Continued)

FOREIGN PATENT DOCUMENTS

| CN | 206532684 U | * | 9/2017 |
|---|---|---|---|
| JP | 2011253888 A | * | 12/2011 |
| JP | 2014-199904 | | 10/2014 |

*Primary Examiner* — Elvin G Enad
*Assistant Examiner* — Malcolm Barnes
(74) *Attorney, Agent, or Firm* — Young Law Firm, P.C.

(57) ABSTRACT

Disclosed herein is a common mode filter that includes: a winding core part including first and second winding areas and a third winding area positioned between the first and second winding areas; and first and second wires wound in a same direction around the winding core part. The first and second wires constitute a first winding block wound in the first winding area and a second winding block wound in the second winding area. The first and second wires cross each other in the third winding area. Each of the first and second winding blocks has first and second winding layers. The difference in a number of turns between the first winding layer and the second winding layer is larger in the first winding block than in the second winding block.

20 Claims, 12 Drawing Sheets

(56) References Cited

U.S. PATENT DOCUMENTS

| | | | | |
|---|---|---|---|---|
| 2015/0162126 A1* | 6/2015 | Kanbe | ................ | H01F 27/2823 |
| | | | | 29/605 |
| 2015/0371766 A1* | 12/2015 | Kawasaki | ............ | H01F 17/045 |
| | | | | 336/212 |
| 2017/0025212 A1* | 1/2017 | Jerez | ...................... | H01F 41/07 |
| 2017/0069418 A1* | 3/2017 | Yamakita | ................ | H01F 27/29 |
| 2017/0169935 A1* | 6/2017 | Miyamoto | ............. | H01F 17/03 |
| 2017/0288626 A1* | 10/2017 | Kobayashi | ............... | H03H 1/00 |
| 2017/0294264 A1* | 10/2017 | Hashimoto | ......... | H01F 27/2823 |
| 2018/0096782 A1* | 4/2018 | Miyamoto | ............. | H01F 27/24 |

* cited by examiner

COMMON MODE FILTER

BACKGROUND OF THE INVENTION

Field of the Invention

The present invention relates to a common mode filter and, more particularly, to a common mode filter of a type in which a pair of wires cross each other on the way and a manufacturing method therefor.

Description of Related Art

A common mode filter is widely used in many electronic devices, such as mobile electronic devices and on-vehicle LANs, as an element for removing common mode noise superimposed on differential signal lines. In recent years, a common mode filter using a surface-mountable drum core supersedes a common mode filter using a toroidal core (see JP 2014-199904 A).

In the common mode filter described in JP 2014-199904 A, a pair of wires are made to cross each other on the way to thereby enhance symmetry between differential signals in a high-frequency region.

However, when the pair of wires are made to cross each other on the way, the positional relationship between the wires is inverted, so that it is necessary to cross the wires once again in order to restore the positional relationship to its original state. Then, when the second crossing is made near the wire end portion, a difference occurs, in which the wires cross each other at one end portion while they do not cross each other at the other end portion, which may cause deterioration of reflection characteristics (return loss).

SUMMARY

It is therefore an object of the present invention to improve reflection characteristics in the common mode filter in which the pair of wires are made to cross each other.

A common mode filter according to the present invention includes a winding core part and first and second wires wound in the same direction around the winding core part. The winding core part includes a first winding area positioned on one axial end side thereof, a second winding area positioned on the other axial end side thereof, and a third winding area positioned between the first and second winding areas. The first and second wires constitute a first winding block wound in the first winding area and a second winding block wound in the second winding area and cross each other in the third winding area. The first and second winding blocks each have a first winding layer positioned in the lower layer and a second winding layer positioned on the upper layer of the first winding layer. The difference in the number of turns between the first winding layer and the second winding layer is larger in the first winding block than in the second winding block.

According to the present invention, a capacitance component generated between the first and second wires changes with respect to that when the first and second winding blocks are completely symmetric. Although its concrete mechanism is not yet revealed, even when there exists a difference in that a pair of wires cross each other in one end portion and they do not cross each other in the other end portion, the change suppresses unbalance caused due to the difference, with the result that reflection characteristics can be improved.

In the present invention, the first winding block may include a first layer part in which one of the first and second wires is positioned in the first winding layer and the other one thereof is positioned in the second winding layer and a non-layer part in which both the first and second wires are positioned in the first winding layer. With this configuration, it is possible to change reflection characteristics by adjusting the number of turns in the non-layer part.

In the present invention, the second winding block may include a second layer part in which one of the first and second wires is positioned in the first winding layer and the other one thereof is positioned in the second winding layer. This enhances symmetry between the first and second winding blocks, making it possible to obtain excellent high-frequency characteristics.

In the present invention, the number of turns in the first layer part and the number of turns in the second layer part may be equal to each other. This makes the first and second layer parts symmetric with respect to a portion where the first and second wires cross each other, making it possible to obtain more excellent high-frequency characteristics.

In the present invention, the first and second wires may be positioned in the first winding layer and second winding layer, respectively, in the first layer part, and the first and second wires may be positioned in the second winding layer and first winding layer, respectively, in the second layer part. This can reduce the difference between the lengths of the first and second wires.

The common mode filter according to the present invention may further include a first flange part provided at one axial end of the winding core part, a second flange part positioned at the other axial end of the winding core part, first and second terminal electrodes provided on the first flange part and connected respectively with one ends of the first and second wires, and third and fourth terminal electrodes provided on the second flange part and connected respectively with the other ends of the first and second wires, and the non-layer part may be positioned between the one ends of the first and second wires and the first layer part. This can change a capacitance component generated in the vicinity of the one ends of the first and second wires.

In the present invention, the numbers of turns of the first and second wires in the non-layer part may be both one, and the first and second wires may be wound so as to be along with each other. This can improve reflection characteristics in a band of 10 MHz to 400 MHz.

In the present invention, a configuration may be adopted, in which the first and second wires do not cross each other in the first winding block and cross each other in the second winding block. It follows that the wires cross each other in the second and third winding areas, thereby allowing the positional relationship between the pair of wires on one end side and the positional relationship therebetween on the other end side to coincide with each other.

In the present invention, in the second winding block, the last turns, which are closest to the other ends of the respective first and second wires, of the respective first and second wires may cross each other. This enhances the symmetry between the first and second winding blocks, making it possible to obtain excellent high-frequency characteristics.

As described above, according to the present invention, it is possible to enhance the reflection characteristics of the common mode filter in which the pair of wires are made to cross each other on the way.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
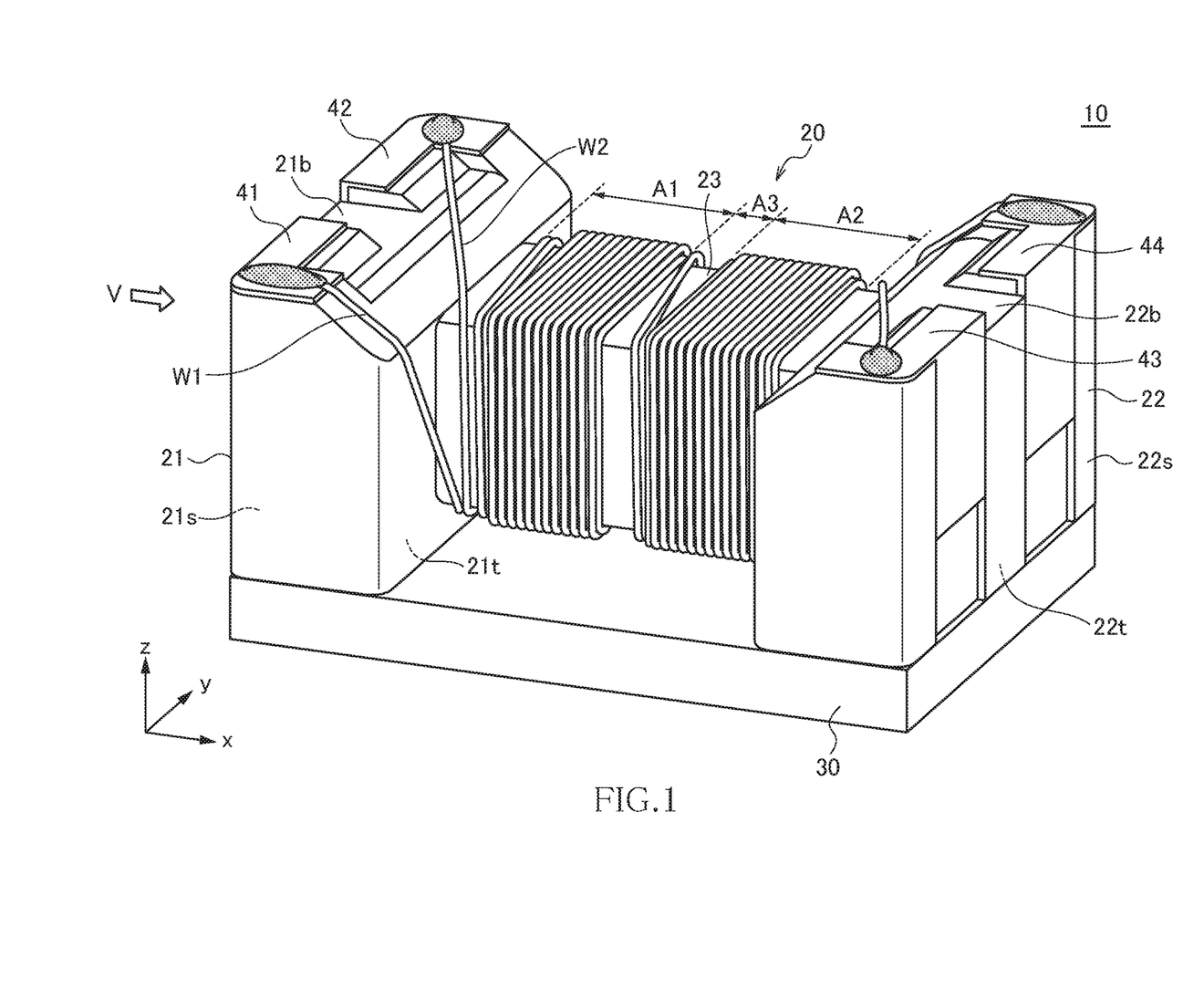
FIG. 1 is a schematic perspective view illustrating the outer appearance of a common mode filter according to a preferred embodiment of the present invention.

FIG. 1 is a schematic perspective view illustrating the outer appearance of a common mode filter 10 according to a preferred embodiment of the present invention.

As illustrated in FIG. 1, the common mode filter 10 according to the present embodiment includes a drum core 20, a plate core 30, first to fourth terminal electrodes 41 to 44, and first and second wires W1 and W2. The drum core 20 and plate core 30 are each made of a magnetic material having comparatively high permeability, such as an Ni—Zn based ferrite. The first to fourth terminal electrodes 41 to 44 are each a metal fitting made of a good conductor material such as copper. The first to fourth terminal electrodes 41 to 44 may be obtained by directly baking silver paste or the like onto the drum core 20.

The drum core 20 has a first flange part 21, a second flange part 22, and a winding core part 23 disposed between the first and second flange parts 21 and 22. The winding core part 23 has its axial direction in the x-direction. The first and second flange parts 21 and 22 are disposed at both ends of the winding core part 23 in the axial direction and integrally formed with the winding core part 23. The plate core 30 is bonded to upper surfaces 21$t$ and 22$t$ of the respective flange parts 21 and 22. The upper surfaces 21$t$ and 22$t$ of the respective flange parts 21 and 22 constitute the xy plane, and their opposite surfaces are used as mounting surfaces 21$b$ and 22$b$. The first and second terminal electrodes 41 and 42 are each provided on the mounting surface 21$b$ and an outer surface 21$s$ of the first flange part 21, and the third and fourth terminal electrodes 43 and 44 are each provided on the mounting surface 22$b$ and an outer surface 22$s$ of the second flange part 22. The outer surfaces 21$s$ and 22$s$ each constitute the yz plane. The first to fourth terminals 41 to 44 are fixed by using an adhesive or the like.

The first and second wires W1 and W2 are wound around the winding core part 23 in the same direction. One and the other ends of the first wire W1 are connected respectively to the first and third terminal electrodes 41 and 43, and one and the other ends of the second wire W2 are connected respectively to the second and fourth terminal electrodes 42 and 44. The numbers of turns of the first and second wires W1 and W2 are the same.

As illustrated in FIG. 1, the winding core part 23 of the drum core 20 includes a first winding area A1 positioned on the first flange part 21 side, a second winding area A2 positioned on the second flange part 22 side, and a third winding area A3 positioned between the first and second winding areas A1 and A2. The first and second wires W1 and W2 are aligned and wound in the first and second winding areas A1 and A2 and cross each other in the third winding area A3. When the first and second wires W1 and W2 cross each other, the positional relationship between the first and second wires W1 and W2 is inverted before and after the crossing point.

Figure 2:
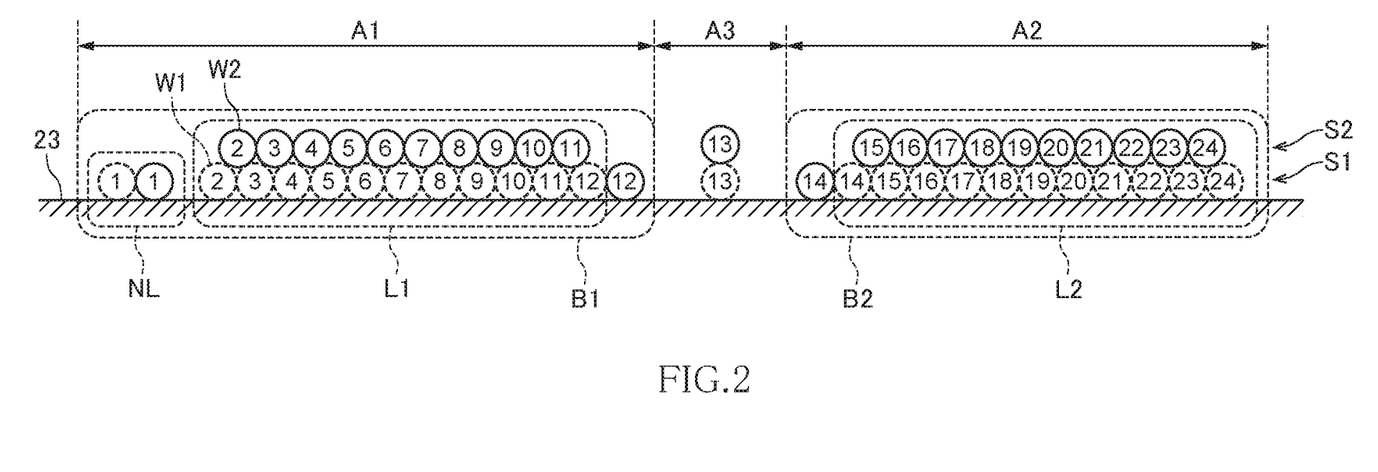
FIG. 2 is a schematic view for more specifically explaining the winding layout of the first and second wires.

FIG. 2 is a schematic view for more specifically explaining the winding layout of the first and second wires W1 and W2.

As illustrated in FIG. 2, the first and second wires W1 and W2 constitute a first winding block B1 wound around the first winding area A1 and a second winding block B2 wound around the second winding area A2 and, as described above, cross each other in the third winding area A3. In the example of FIG. 2, the first and second wires W1 and W2 each have a 24-turn configuration including 1st to 24th turns, but not limited thereto. Further, the first and second winding blocks B1 and B2 each have a double layer structure including a first winding layer S1 positioned in the lower layer and directly wound around the winding core part 23 and a second winding layer S2 positioned on the upper layer of the first winding layer S1 and wound around the winding core part 23 through the first winding layer S1.

The first winding block B1 includes a first layer part L1 in which the first and second wires W1 and W2 are positioned in the first winding layer S1 (lower layer) and in the second winding layer S2 (upper layer), respectively, and a non-layer part NL in which both the first and second wires W1 and W2 are positioned in the first winding layer S1 (lower layer). In the present embodiment, when the number of turns is counted with the first and second terminal electrodes 41 and 42 as the starting point, the 1st turns of the respective first and second wires W1 and W2 constitute the non-layer part NL, and the 2nd to 12th turns of the first wire W1 and the 2nd to 11th turns of the second wire W2 constitute the first layer part L1. In the non-layer part NL, the first and second wires W1 and W2 are wound so as to be along with each other. A winding pattern like this is generally called "bifilar winding". Although the 12th turn of the second wire W2 is positioned in the first winding layer S1, it may be regarded as a part of the first layer part L1. This is because, in order to make the wires constituting the double layer structure stable, it is necessary to wound the upper layer wire along the valley line of the adjacent wires positioned in the lower layer, so that the number of turns of the wire positioned in the upper layer is smaller by one than the number of turns of the wire positioned in the lower layer, and the 12th turn of the second wire W2 corresponds to this.

On the other hand, the second winding block B2 has a second layer part L2 in which the first and second wires W1 and W2 are positioned in the first winding layer S1 (lower layer) and in the second winding layer S2 (upper layer), respectively, but does not have the non-layer part. The second layer part L2 includes the 14th to 24th turns of the first wire W1 and the 15th to 24th turns of the second wire W2. Although the 14th turn of the second wire W2 is positioned in the first winding layer S1, it may be regarded as a part of the second layer part L2 for the reason described above.

With the above configuration, in the first winding block B1, the number of turns in the first winding layer S1 (lower layer) is 14, and the number of turns in the second winding layer S2 (upper layer) is 10, so the difference therebetween is 4. On the other hand, in the second winding block B2, the number of turns in the first winding layer S1 (lower layer) is 12, and the number of turns in the second winding layer S2 (upper layer) is 10, so the difference therebetween is 2. As described above, in the present embodiment, the difference in the number of turns between the first winding layer S1 and the second winding layer S2 is larger by two in the first winding block B1 than in the second winding block B2. The difference of two turns is due to the existence of the non-layer part NL. In the non-layer part NL, a capacitance component generated between the first and second wires W1 and W2 is different from that generated therebetween in the first layer part L1 and that generated therebetween in the second layer part L2.

The 13th turns of the respective first and second wires W1 and W2 cross each other in the third winding area A3. When the first and second wires W1 and W2 cross each other, the positional relationship between the first and second wires W1 and W2 is inverted before and after the crossing point. Specifically, when focusing on the same turns of the first and second wires W1 and W2, the first wire W1 is positioned on the left side (first flange part 21 side) in FIG. 2, and the second wire W2 is positioned on the right side (second flange part 22 side) in FIG. 2 in the first winding block B1; whereas the first wire W1 is positioned on the right side (second flange part 22 side) in FIG. 2, and the second wire W2 is positioned on the left side (first flange part 21 side) in FIG. 2 in the second winding block B2. Thus, the first layer part L1 and the second layer part L2 are symmetric with respect to the third winding area A3, enhancing symmetry between signals flowing in the first and second wires W1 and W2, with the result that excellent high-frequency characteristics can be obtained. In addition, in the present embodiment, the number of turns in the first layer part L1 and that in the second layer part L2 are equal to each other, so that extremely excellent high-frequency characteristics can be achieved.

As illustrated in FIG. 1, in the present embodiment, the y-direction positions of the first and third terminal electrodes 41 and 43 connected with the first wire W1 are the same, and the y-direction positions of the second and fourth terminal electrodes 42 and 44 connected with the second wire W2 are the same. When viewed in the direction of the arrow V of FIG. 1, the first and third terminal electrodes 41 and 43 connected with the first wire W1 are positioned on the right side, and the second and fourth terminal electrodes 42 and 44 connected with the second wire W2 are positioned on the left side. Thus, when the first and second wires W1 and W2 are wound clockwise as viewed in the direction of the arrow V with the first and second terminal electrodes 41 and 42 as the starting point, the first wire W1 is positioned on the left side (first flange part 21 side) in FIG. 2, and the second wire W2 is positioned on the right side (second flange part 22 side) in FIG. 2 in the first winding block B1 when focusing on the same turns of the first and second wires W1 and W2 unless the wires are made to cross each other. In the present embodiment, the first and second wires W1 and W2 do not cross each other in the first winding block B1, so that the above positional relationship is maintained over the entire area of the first winding block B1.

When the first and second wires W1 and W2 are made to cross each other in the third winding are A3, the positional relationship between the first and second wires W1 and W2 is inverted. Thus, in the second winding block B2, the first wire W1 is positioned on the right side (second flange part 22 side) in FIG. 2, and the second wire W2 is positioned on the left side (first flange part 21 side) in FIG. 2 when focusing on the same turns of the first and second wires W1 and W2.

However, as described above, when viewed in the direction of the arrow V of FIG. 1, the third terminal electrode 43 is positioned on the right side, and the fourth terminal electrode 44 is positioned on the left side, so that in order to connect the terminal ends of the respective first and second wires W1 and W2 to the third and fourth terminal electrodes 43 and 44, respectively, it is necessary to make the first and second wires W1 and W2 cross each other once again so as to restore the positional relationship to its original state. In the present embodiment, the last 24th turns, which are closest to the third and fourth electrode terminals 43 and 44, of the respective first and second wires W1 and W2 constituting the second winding block B2 are made to cross each other.

Figure 3:
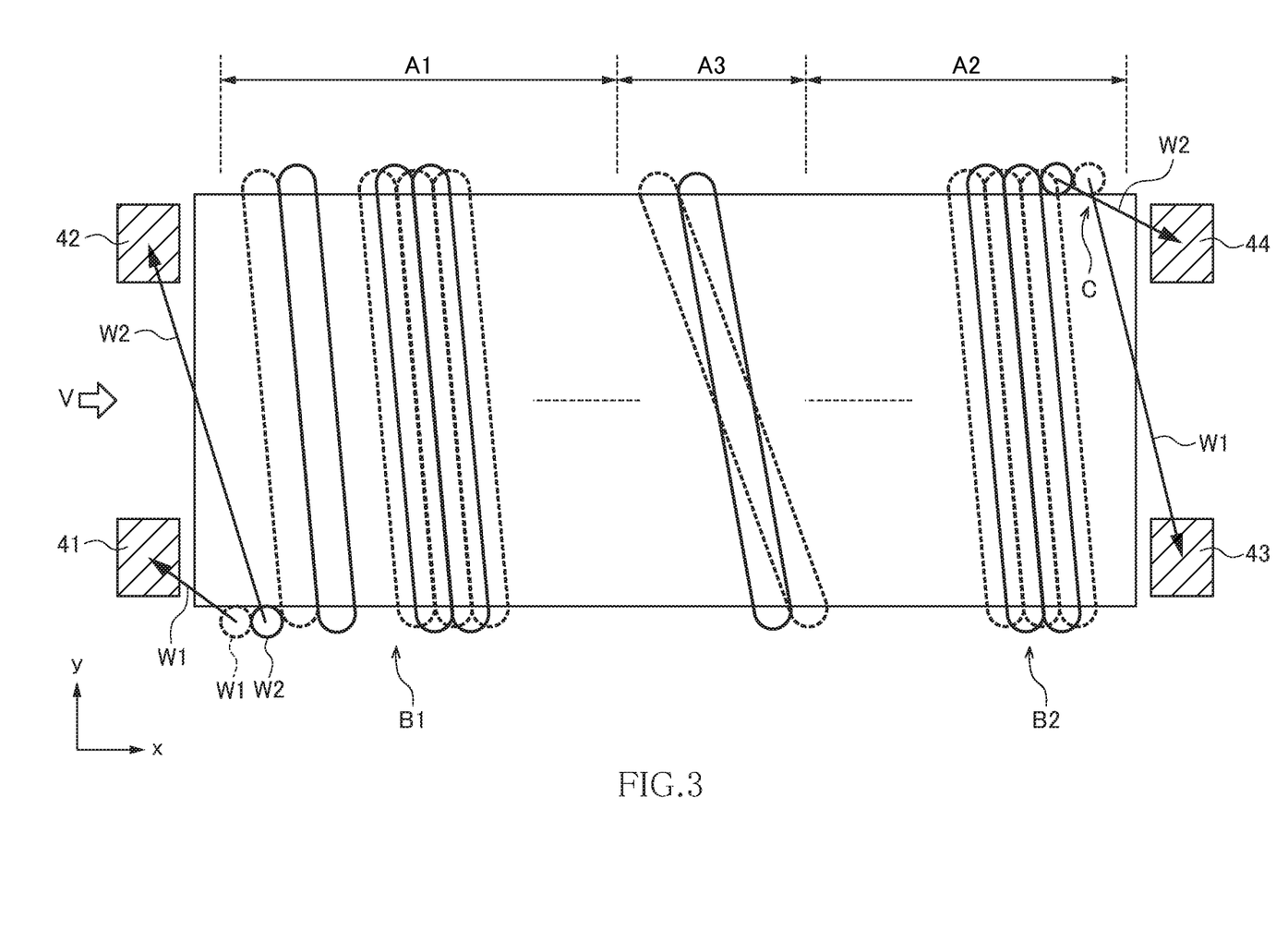
FIG. 3 is a schematic view for explaining a state where the 24th turns of the respective first and second wires cross each other.

FIG. 3 is a schematic view for explaining a state where the 24th turns of the respective first and second wires W1 and W2 cross each other.

As illustrated in FIG. 3, when viewed in the direction of the arrow V, the first terminal electrode 41 is positioned on the right side, and the second terminal electrode 42 is positioned on the left side, so that when the first and second wires W1 and W2 are wound clockwise without being made to cross each other, the first wire W1 is positioned on the first flange part 21 side, and the second wire W2 is positioned on the second flange part 22 side. This positional relationship is inverted in the second winding block B2. That is, the first wire W1 is positioned on the second flange part 22 side, and the second wire W2 is positioned on the first flange part 21 side. In order to connect the terminal ends of the respective first and second wires W1 and W2 respectively to the third and fourth terminal electrodes 43 and 44 in this state, the last 24th turns of the respective first and second wires W1 and W2 need to cross each other as denoted by the arrow C since the third terminal electrode 43 is positioned on the right side, and the fourth terminal electrode 44 is positioned on the left side as viewed in the direction of the arrow V.

Figure 4:
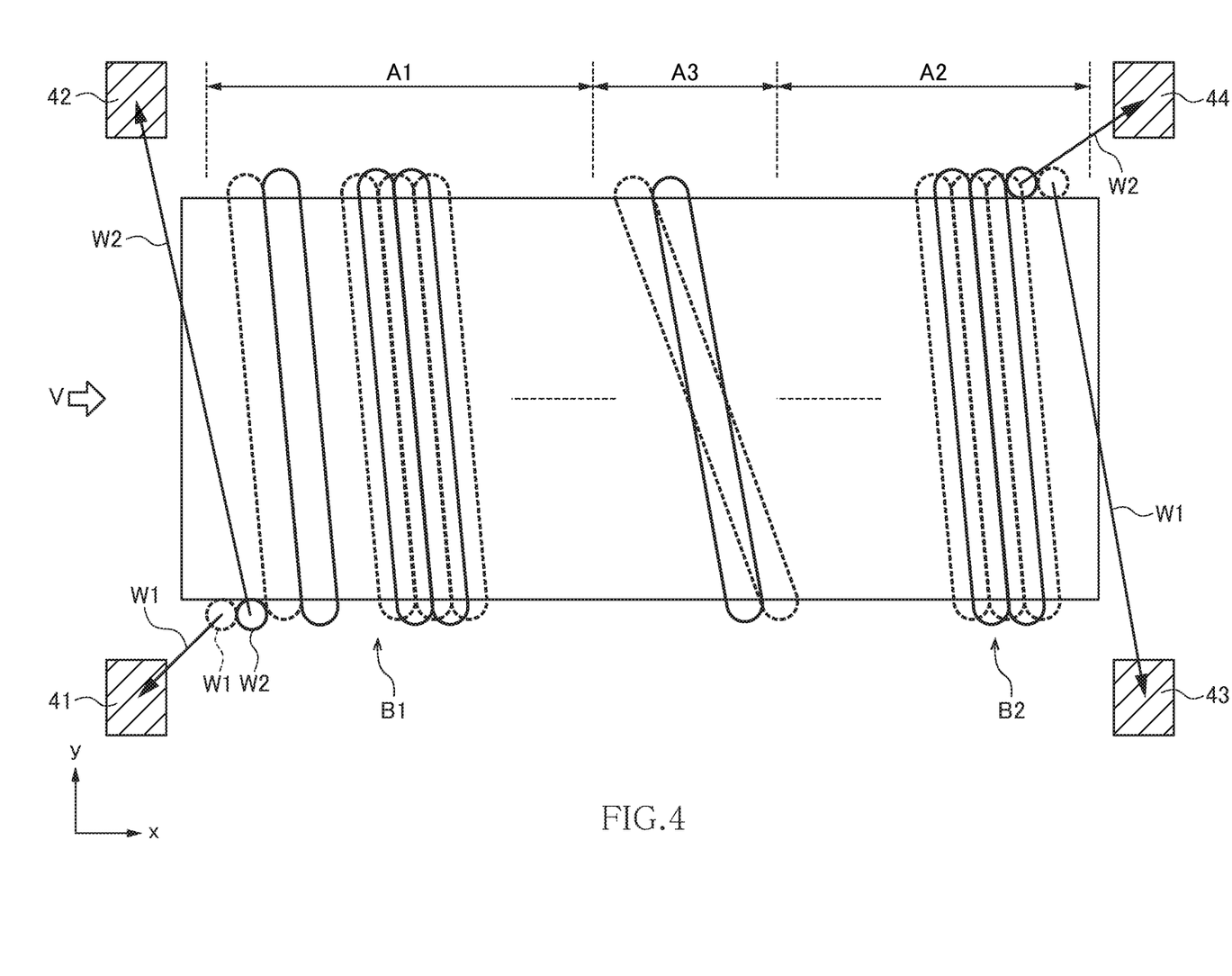
FIG. 4 is a schematic view for explaining another state where the 24th turns of the respective first and second wires cross each other.
Figure 5:
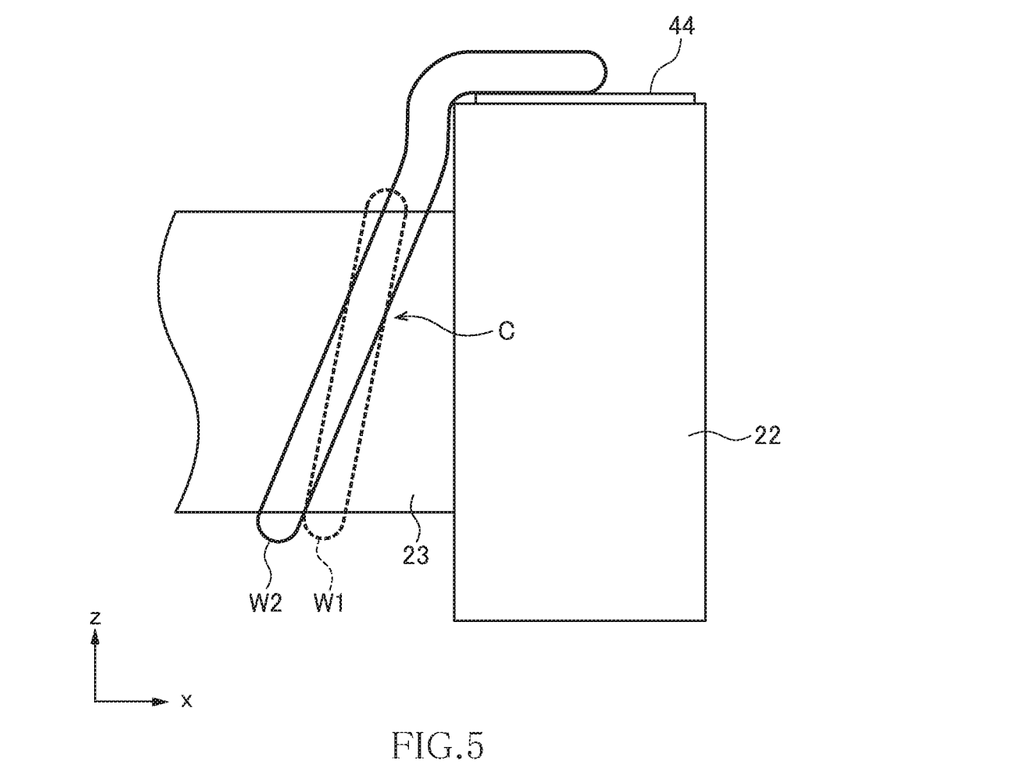
FIG. 5 is a schematic view for explaining still another state where the 24th turns of the respective first and second wires cross each other.

When the distance between the third and fourth terminal electrodes 43 and 44 in the y-direction is large as illustrated in FIG. 4, the 24th turns of the respective first and second wires W1 and W2 do not cross each other apparently as viewed from above (as viewed in the z-direction). However, in this case, as illustrated in FIG. 5, the first and second wires W1 and W2 cross each other on the xz surface of the winding core part 23. That is, at any rate, by making the 24th turns of the respective first and second wires W1 and W2 cross each other, the positional relationship between the first and second wires W1 and W2 is restored to its original state.

As described above, the 1st turns of the respective first and second wires W1 and W2 positioned on one end side do not cross each other, but the 24th turns positioned on the other end side cross each other. Thus, there occurs a difference between a capacitance component generated at the one end side and that generated at the other end side, and this unbalance can cause deterioration in reflection characteristics. However, in the common mode filter 10 according to the present invention, the non-layer part NL is selectively provided on the one end side of the first and second wires W1 and W2, thereby improving reflection characteristics. Although its mechanism is not yet revealed, it can be considered that the existence of the non-layer part NL may cause a new difference between a capacitance component generated at the one end side and that generated at the other end side, which contributes to suppression of the unbalance.

Figure 6:
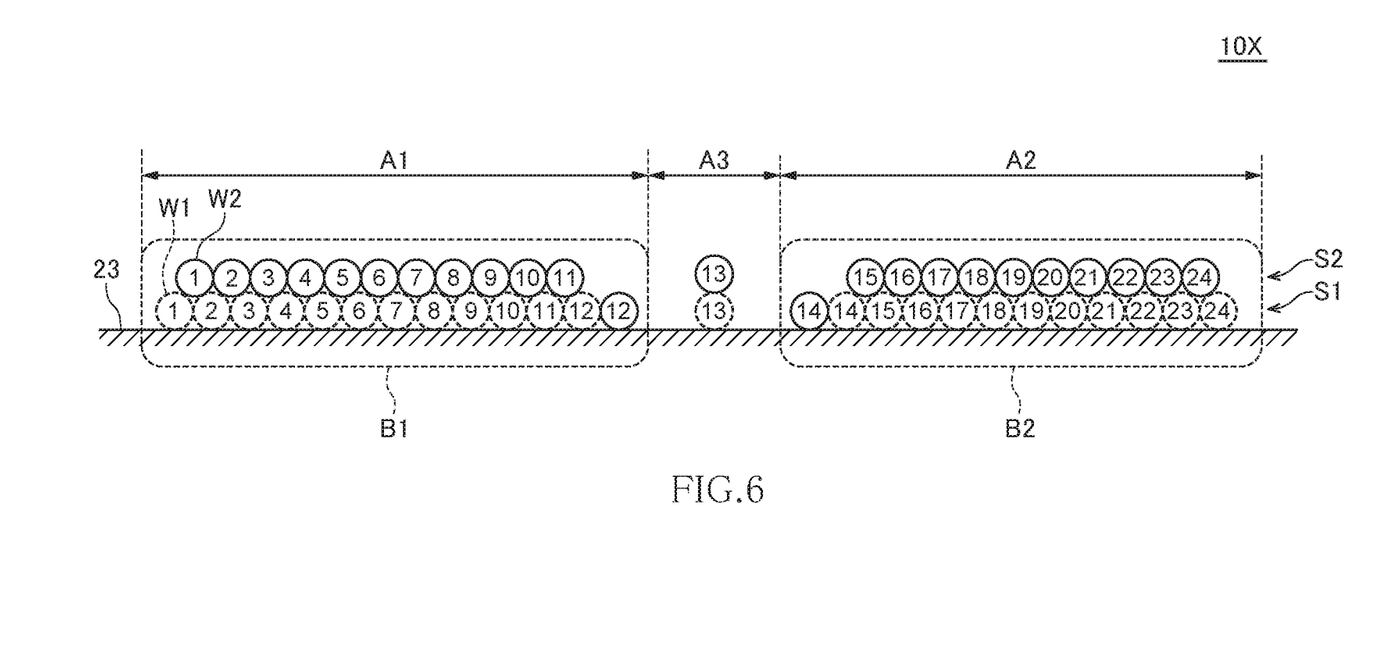
FIG. 6 is a schematic view for explaining the winding layout of a common mode filter according to a comparative example.
Figure 7:
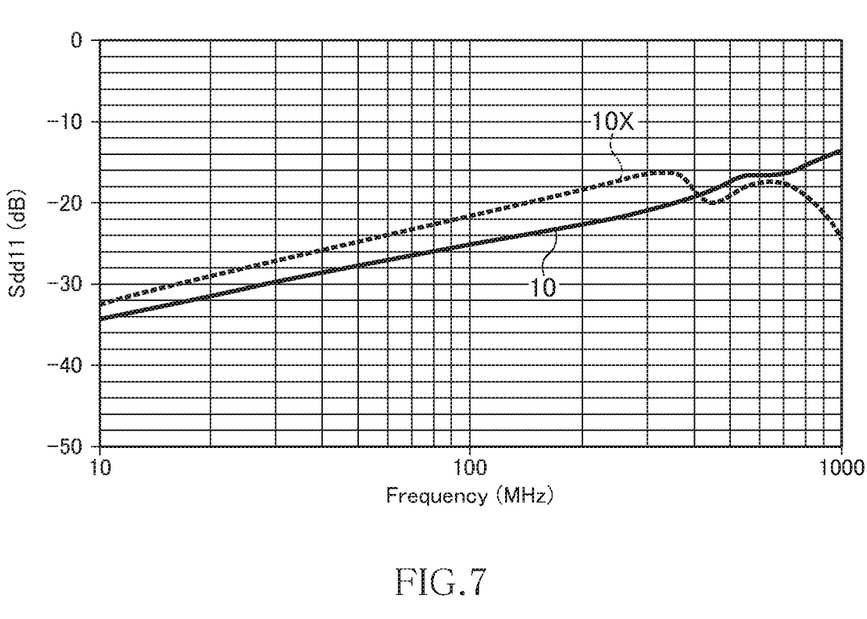
FIG. 7 is a graph illustrating the reflection characteristics (Sdd11 characteristics) of the common mode filter according to the embodiment and those of the common mode filter according to the comparative example.

FIG. 6 is a schematic view for explaining the winding layout of a common mode filter 10X according to a comparative example. In the example of FIG. 6, the non-layer part NL is not included in the first winding block B1. FIG. 7 is a graph illustrating the reflection characteristics (Sdd11 characteristics) of the common mode filter 10 according to the embodiment and those of the common mode filter 10X according to the comparative example. The graph of FIG. 7 reveals that the common mode filter 10 having the non-layer part NL of one turn can obtain more excellent reflection characteristics than those of the common mode filter 10X according to the comparative example in a band of 10 MHz to 400 MHz.

As described above, in the common mode filter 10 according to the present embodiment, since the first and second wires W1 and W2 are made to cross each other in the third winding area A3, symmetry between the first and second winding blocks B1 and B2 is enhanced. In addition, the non-layer part NL is included in the first winding block B1, so that unbalance caused due to the crossing of the 24th turns in the second winding block B2 is suppressed, with the result that reflection characteristics can be improved.

Particularly, in the present embodiment, the numbers of turns of the first and second wires W1 and W2 in the non-layer part NL are both one, so that reflection characteristics in a band of 10 MHz to 400 MHz are improved. In addition, in the present embodiment, the number of turns in the first layer part L1 included in the first winding block B1 and the number of turns in the second layer part L2 included in the second winding block B2 are equal to each other, so that the first layer part L1 and the second layer part L2 are symmetric with respect to a portion where the first and second wires W1 and W2 cross each other in the third winding area A3, with the result that more excellent high-frequency characteristics can be obtained.

Hereinafter, some modifications of the common mode filter 10 will be described. The structures of the modifications described below are also included in the scope of the present invention.

Figure 8:
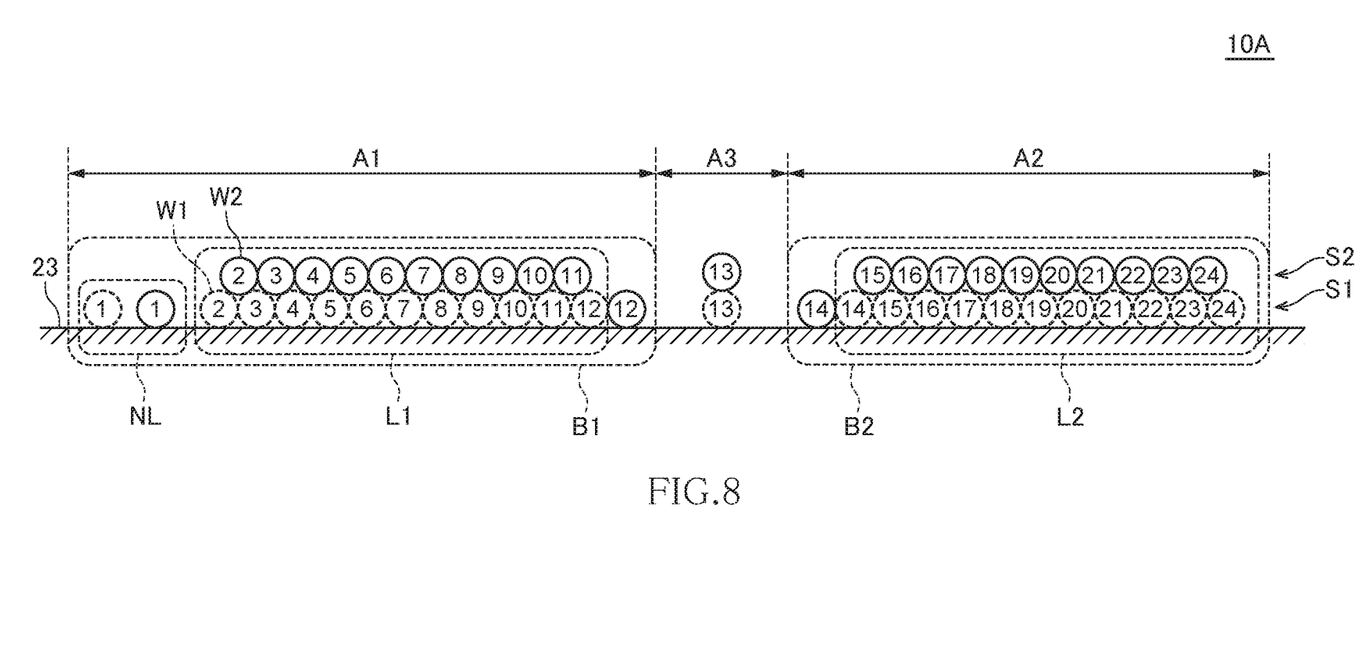
FIG. 8 is a schematic view for explaining the winding layout of a common mode filter according to a first modification.

FIG. 8 is a schematic view for explaining the winding layout of a common mode filter 10A according to a first modification.

The common mode filter 10A illustrated in FIG. 8 differs from the common mode filter 10 according to the above embodiment in that the 1st turns of the respective first and second wires W1 and W2 constituting the non-layer part NL do not contact each other but are separated from each other. As exemplified in the first modification, the first and second wires W1 and W2 constituting the non-layer part NL may contact each other or may be separated from each other as long as they are positioned in the first winding layer S1 (lower layer).

Figure 9:
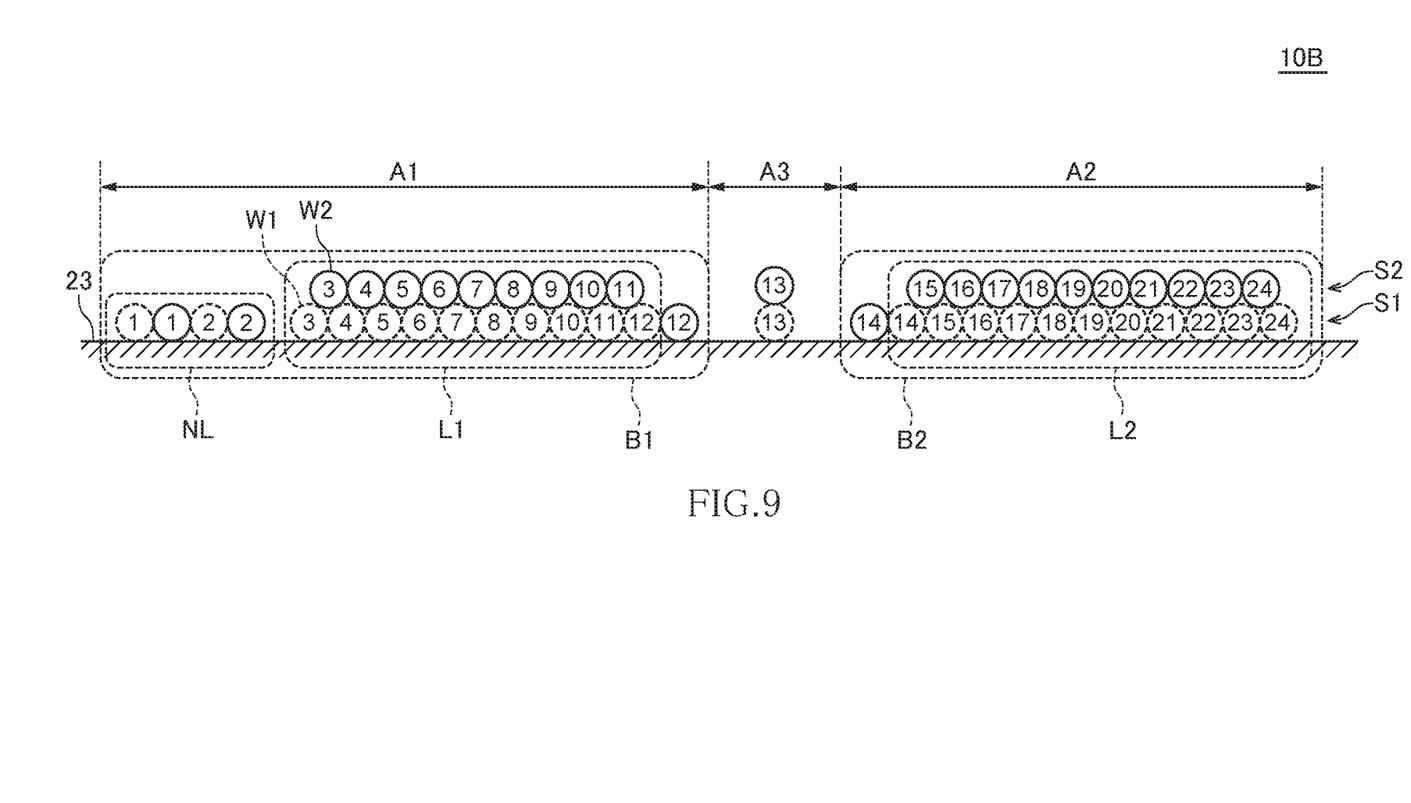
FIG. 9 is a schematic view for explaining the winding layout of a common mode filter according to a second modification.

FIG. 9 is a schematic view for explaining the winding layout of a common mode filter 10B according to a second modification.

The common mode filter 10B illustrated in FIG. 9 differs from the common mode filter 10 according to the above embodiment in that the first and second wires W1 and W2 constituting the non-layer part NL are each turned twice. As exemplified in the second modification, the numbers of turns of the first and second wires W1 and W2 constituting the non-layer part NL are not particularly limited but may be determined according to the total number of turns or target high-frequency characteristics.

Figure 10:
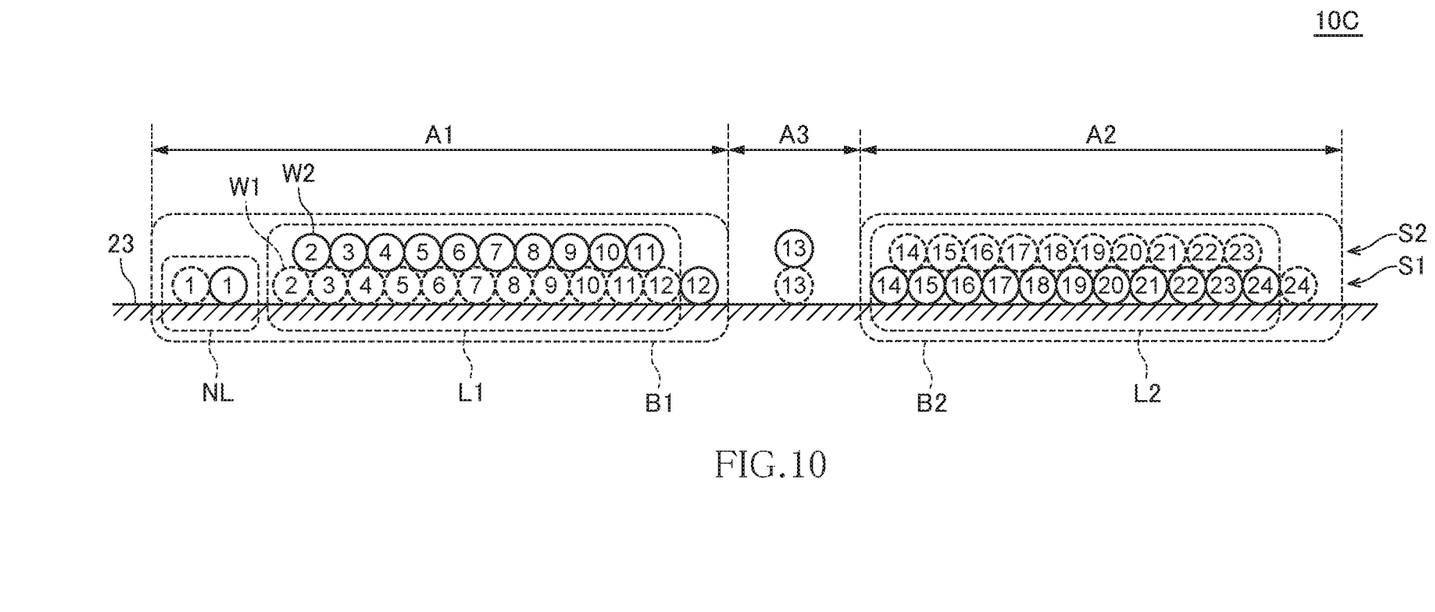
FIG. 10 is a schematic view for explaining the winding layout of a common mode filter according to a third modification.

FIG. 10 is a schematic view for explaining the winding layout of a common mode filter 10C according to a third modification.

The common mode filter 10C illustrated in FIG. 10 differs from the common mode filter 10 according to the above embodiment in that, in the second layer part L2, the second wire W2 is positioned in the first winding layer S1 (lower layer), and the first wire W1 is positioned in the second winding layer S2 (upper layer). Although the 24th turn of the first wire W1 is positioned in the first winding layer S1 (lower layer), it may be regarded as a part of the second layer part L2. As exemplified in the third modification, the vertical positional relationship between the first and second wires W1 and W2 may be inverted in the first layer part L1 and in the second layer part L2. This brings about an advantage that the lengths of the first and second wires W1 and W2 are substantially equal to each other.

Figure 11:
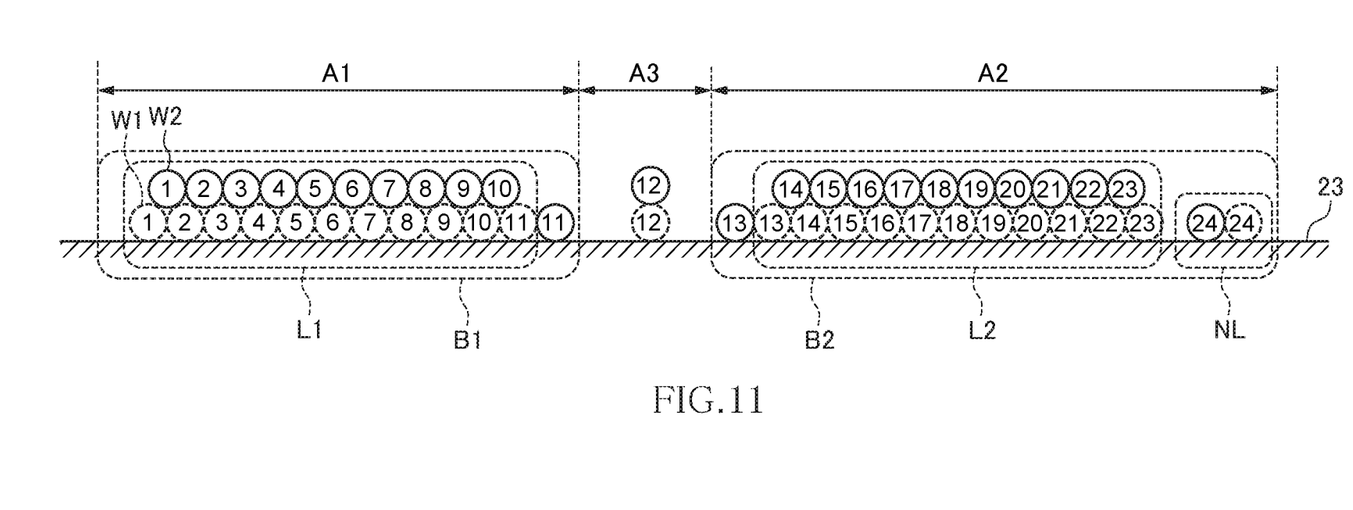
FIG. 11 is a schematic view for explaining the winding layout of a common mode filter according to a fourth modification.

FIG. 11 is a schematic view for explaining the winding layout of a common mode filter 10D according to a fourth modification.

In the common mode filter 10D illustrated in FIG. 11, the non-layer part NL is included in the second winding block B2. Specifically, the 1st to 11th turns of the first wire W1 and 1st to 10th turns (or 1st to 11th turns) of the second wire W2 constitute the first layer part L1, the 12th turns of the respective first and second wires W1 and W2 cross each other, the 13th to 23rd turns of the first wire W1 and the 14th to 23rd turns (or 13th to 23rd turns) of the second wire W2 constitute the second layer part L2, and the 24th turns of the respective first and second wires W1 and W2 constitute the non-layer part NL. Like the common mode filter 10 according to the above embodiment, the 24th turns of the respective first and second wires W1 and W2 cross each other in the vicinity of the third and fourth terminal electrodes 43 and 44. As exemplified in the fourth modification, the crossing turns may constitute the non-layer part NL, depending on required characteristics.

Figure 12:
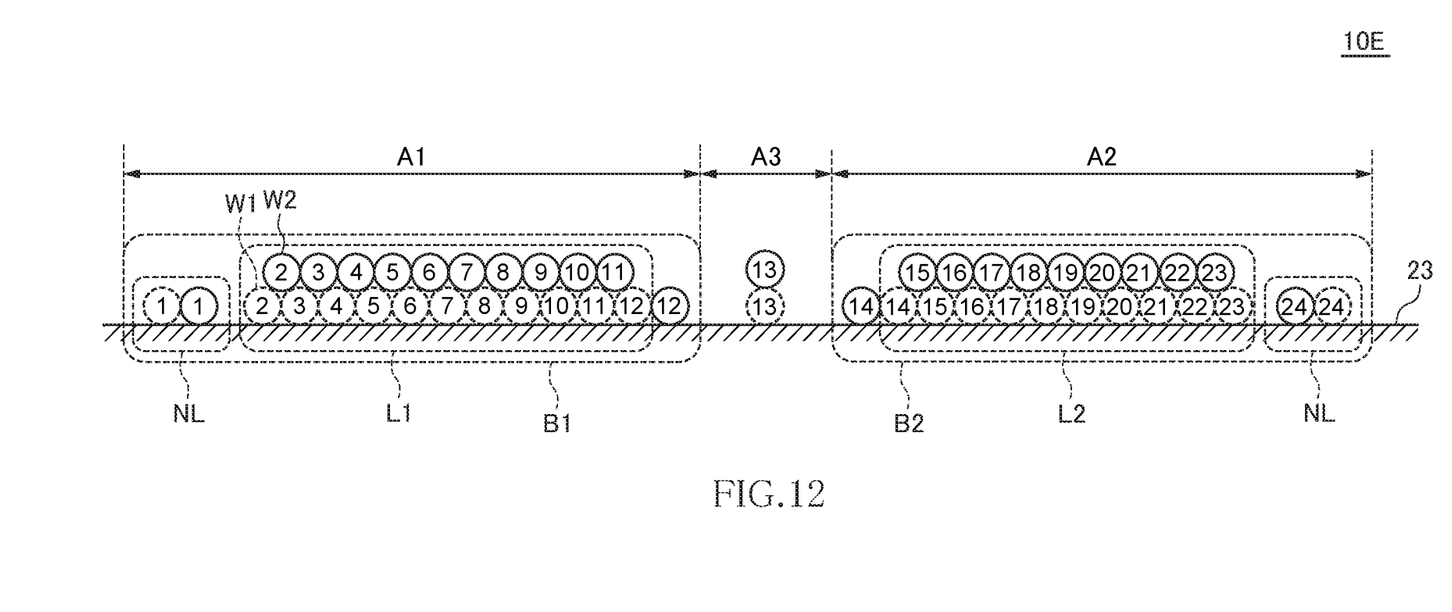
FIG. 12 is a schematic view for explaining the winding layout of a common mode filter according to a fifth modification.

FIG. 12 is a schematic view for explaining the winding layout of a common mode filter 10E according to a fifth modification.

In the common mode filter 10E illustrated in FIG. 12, the non-layer part NL is included in both the first and second winding blocks B1 and B2. Specifically, the 1st turns of the respective first and second wires W1 and W2 constitute the non-layer part NL, the 2nd to 12th turns of the first wire W1 and the 2nd to 11th turns (or 2nd to 12th turns) of the second wire W2 constitute the first layer part L1, the 13th turns of the respective first and second wires W1 and W2 cross each other, the 14th to 23rd turns of the first wire W1 and the 15th to 23rd turns (or 14th to 23rd turns) of the second wire W2 constitute the second layer part L2, and the 24th turns of the respective first and second wires W1 and W2 constitute the non-layer part NL. As exemplified in the fifth modification, the non-layer part NL may be included in both the first and second winding blocks B1 and B2, depending on required characteristics.

It is apparent that the present invention is not limited to the above embodiments, but may be modified and changed without departing from the scope and spirit of the invention.

For example, in the above embodiment, the first and second wires W1 and W2 are each wound in a direction from the 1st turn to the 24th turn at the time of manufacture; however, conversely, they may be wound in a direction from the 24th turn to the 1st turn.

What is claimed is:

1. A common mode filter comprising:
    a winding core part including a first winding area positioned on one axial end side, a second winding area positioned on other axial end side, and a third winding area positioned between the first and second winding areas; and
    first and second wires wound in a same direction around the winding core part,
    wherein the first and second wires constitute a first winding block wound in the first winding area and a second winding block wound in the second winding area,
    wherein the first and second wires cross each other in the third winding area,
    wherein each of the first and second winding blocks has a first winding layer positioned in a lower layer and a second winding layer positioned on an upper layer of the first winding layer,
    wherein the first winding block includes a first layer part in which one of the first and second wires is positioned in the first winding layer and other one thereof is positioned in the second winding layer and a non-layer part in which both the first and second wires are positioned in the first winding layer,
    wherein the first layer part and the non-layer part are apart from each other so as to form a space therebetween, and
    wherein a difference in a number of turns between the first winding layer and the second winding layer is larger in the first winding block than in the second winding block.

2. The common mode filter as claimed in, claim 1, wherein the second winding block includes a second layer part in which one of the first and second wires is positioned in the first winding layer and other one thereof is positioned in the second winding layer.

3. The common mode filter as claimed in claim 2, wherein a number of turns in the first layer part and a number of turns in the second layer part are equal to each other.

4. The common mode filter as claimed in claim 2, wherein the first and second wires are positioned in the first winding layer and second winding layer, respectively, in the first layer part, and the first and second wires are positioned in the second winding layer and first winding layer, respectively, in the second layer part.

5. The common mode filter as claimed in claim 2, further comprising:
    a first flange part provided at the one axial end of the winding core part;
    a second flange part positioned at the other axial end of the winding core part;
    first and second terminal electrodes provided on the first flange part and connected respectively with one ends of the first and second wires; and
    third and fourth terminal electrodes provided on the second flange part and connected respectively with other ends of the first and second wires,
    wherein the non-layer part is positioned between the one ends of the first and second wires and the first layer part.

6. The common mode filter as claimed in claim 5,
    wherein numbers of turns of the first and second wires in the non-layer part are both one, and
    wherein the first and second wires are wound so as to be along with each other in the non-layer part.

7. The common mode filter as claimed in claim 5, wherein the first and second wires do not cross each other in the first winding block and cross each other in the second winding block.

8. The common mode filter as claimed in claim 7, wherein last turns which are closest to the other ends of the respective first and second wires in the second winding block cross each other.

9. A common mode filter comprising:
    a winding core part including first, second, third, fourth and fifth sections arranged in an axial direction in this order; and
    first and second wires wound around the winding core part,
    wherein the first and second wires cross each other in each of the third and fifth sections,
    wherein the first and second wires constitute a double layer structure in each of the second and fourth sections, and
    wherein the first and second wires constitute a single layer structure in the first section such that neither of the first and second wires in the first section overlaps either of the first and second wires in the second section.

10. The common mode filter as claimed in claim 9, wherein the first and second wires do not cross each other in each of the first, second and fourth sections.

11. The common mode filter as claimed in claim 9, wherein the first section is apart from the second section so as to form a space therebetween.

12. The common mode filter as claimed in claim 1, wherein a difference in a number of turns between the first winding layer and the second winding layer in the first winding block is two or more larger than that in the second winding block.

13. The common mode filter as claimed in claim 12, wherein a difference in a number of turns between the first winding layer and the second winding layer in the first winding block is four or more larger than that in the second winding block.

14. The common mode filter as claimed in claim 6,
    wherein the first wire in the non-layer part is a first turn counted from the first terminal electrode,
    wherein the second wire in the non-layer part is a first turn counted from the second terminal electrode,
    wherein second and third turns of each of the first and second wires constitute the first layer part, and
    wherein the second turn of the second wire is wound along a valley line formed by the second and third turns of the first wire.

15. The common mode filter as claimed in claim 14, wherein the first turn of the second wire does not contact with the second turn of the first and second wires.

16. A common mode filter comprising:
    a winding core part including first, second, third, fourth, fifth, and sixth sections arranged in an axial direction in this order; and first and second wires wound around the winding core part, wherein the first and second wires constitute a single layer structure in each of the first, third, and fifth sections such that same turns of the first and second wires contact with the winding core part, wherein the first and second wires constitute a double layer structure in each of the second and sixth sections such that one of same turns of the first and second wires contacts with the winding core part and that other thereof is wound on the one of same turns of the first and second wires so as not to contact with the winding core part, and wherein the first and second wires cross each other in the fourth section.

17. The common mode filter as claimed in claim 16, wherein the first section is apart from the second section so as to form a space therebetween.

18. The common mode filter as claimed in claim 16, wherein the second section contacts with the third section.

19. The common mode filter as claimed in claim 18, wherein the fifth section contacts with the sixth section.

20. The common mode filter as claimed in claim 16, wherein a number of turns in the second section and a number of turns in the sixth section are equal to each other, and wherein a number of turns in the third section and a number of turns in the fifth section are equal to each other.

\* \* \* \* \*